(12) United States Patent
Lake et al.

(10) Patent No.: US 6,458,234 B1
(45) Date of Patent: *Oct. 1, 2002

(54) METHODS OF FIXTURING A FLEXIBLE SUBSTRATE AND A PROCESSING CARRIER AND METHODS OF PROCESSING A FLEXIBLE SUBSTRATE

(75) Inventors: Rickie C. Lake, Eagle; Mark E. Tuttle, Boise; Joseph P. Mousseau, Boise; Clay L. Cirino, Boise, all of ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/421,626

(22) Filed: Oct. 19, 1999

Related U.S. Application Data (63) Continuation of application No. 08/858,021, filed on May 16, 1997, now Pat. No. 5,972,152.

(51) Int. Cl.[7] .......................... B32B 31/00; B44C 1/165
(52) U.S. Cl. .................. 156/230; 156/247; 156/249; 156/329; 156/344
(58) Field of Search .............................. 156/230, 232, 156/235, 192, 241, 249, 297, 299, 247, 302, 329, 344, 323; 428/343, 354, 352, 355, 41.9, 355 RA; 427/208

(56) References Cited

U.S. PATENT DOCUMENTS

| 2,923,651 A | 2/1960 | Petriello ..................... 264/127 |
| 2,984,697 A | 5/1961 | Bontiecur et al. .......... 174/254 |
| 3,215,574 A | 11/1965 | Korb ........................ 29/829 X |
| 3,255,047 A | 6/1966 | Escoffery ................ 174/254 X |
| 3,723,635 A | 3/1973 | Smith ......................... 174/254 |
| 3,780,431 A | 12/1973 | Feeney ........................ 29/830 |

(List continued on next page.)

FOREIGN PATENT DOCUMENTS

| DE | 41 23 370 A 1 | | 1/1993 |
| DE | 195 49 354 A 1 | | 1/1997 |
| GB | 2030779 A | * | 4/1980 |
| JP | 03 262194 A | | 11/1991 |
| JP | 04 220481 A | | 8/1992 |
| JP | 05 017725 A | | 1/1993 |
| JP | 07 022795 A | | 1/1995 |
| JP | 07 188 621 A | | 7/1995 |

OTHER PUBLICATIONS

Patent Abstracts of Japan and Derwent Abstract of JP 05–279640, Oct. 26, 1993.*
International Search Report, International Application No. PCT/US 98/ 10044 (5 pages).
"Adhesives," *The New Encyclopædia Britannica: Macropædia*, 15th ed., 1986, pp. 8–9.
Blake, Jeanne L., *Flexible Circuitry Design Guide*, Sheldahl, Inc., 1984, pp. 1–1–1–12; 2–1–2–20.
Perry, Thomas D., "Adhesives and Glues," [additional publication information unavailable].

*Primary Examiner*—Richard Crispino
*Assistant Examiner*—Kevin P Shortsle
(74) *Attorney, Agent, or Firm*—Wells, St. John, P.S.

(57) ABSTRACT

Methods of fixturing a flexible circuit substrate to a processing carrier are disclosed. In one implementation, the flexible circuit substrate and, processing carrier are attached with an adhesive film provided therebetween. The adhesive film comprises acrylic, silicone or a silicone acrylic blend in a preferred embodiment of the present invention. Ideally, substantially the total surface area of a first surface of the flexible circuit substrate is attached to the processing carrier. The flexible circuit substrate is removed from the adhesive film following processing thereof. In a preferred embodiment of the present invention, the adhesive film is monolithic. An electrical component is attached to the flexible circuit substrate and the flexible circuit substrate is encapsulated in accordance with one implementation of the present invention.

16 Claims, 8 Drawing Sheets

U.S. PATENT DOCUMENTS

| | | |
|---|---|---|
| 3,781,596 A | 12/1973 | Galli et al. .................. 361/751 |
| 3,818,279 A | 6/1974 | Seeger, Jr. et al. ......... 361/751 |
| 4,075,420 A | 2/1978 | Walton ....................... 174/251 |
| 4,177,519 A | 12/1979 | Kasubuchi et al. ......... 364/712 |
| 4,226,659 A | 10/1980 | Griffith et al. |
| 4,463,053 A | 7/1984 | Brinegar |
| 4,489,487 A | 12/1984 | Bura |
| 4,681,654 A | 7/1987 | Clementi et al. ......... 29/827 X |
| 4,780,347 A | 10/1988 | Cohen |
| 4,796,078 A | 1/1989 | Phelps, Jr. et al. |
| 4,800,461 A | 1/1989 | Dixon et al. .............. 29/846 X |
| 4,839,206 A | 6/1989 | Waldenberger |
| 5,032,438 A | 7/1991 | Sakumoto et al. |
| 5,177,596 A | 1/1993 | Muramatsu et al. ........ 174/254 |
| 5,177,863 A | 1/1993 | Lam ............................ 29/830 |
| 5,191,738 A * | 3/1993 | Nakazato et al. ............. 51/238 |
| 5,227,232 A | 7/1993 | Lim |
| 5,350,059 A | 9/1994 | Chester et al. |
| 5,452,140 A | 9/1995 | Kody |
| 5,476,566 A | 12/1995 | Cavisin |
| 5,533,288 A | 7/1996 | Lambert |
| 5,572,346 A | 11/1996 | Sakamoto et al. ...... 174/254 X |
| 5,631,622 A | 5/1997 | Hauber et al. |
| 5,869,150 A * | 2/1999 | Iwamoto ........................ 428/1 |
| 5,972,152 A | 10/1999 | Lake et al. |
| 6,134,776 A * | 10/2000 | Hoffmeyer .................. 29/840 |
| 6,139,953 A * | 10/2000 | Nagamoto et al. .......... 428/343 |

\* cited by examiner

METHODS OF FIXTURING A FLEXIBLE SUBSTRATE AND A PROCESSING CARRIER AND METHODS OF PROCESSING A FLEXIBLE SUBSTRATE

RELATED PATENT DATA

This patent resulted from a continuation of and claims priority to U.S. patent application Ser. No. 08/858,021, filed May 16, 1997, now U.S. Pat. No. 5,972,152, which issued Oct. 26, 1999, entitled "Methods of Fixturing Flexible Circuit Substrates and a Processing Carrier, Processing a Flexible Circuit and Processing a Flexible Circuit Substrate Relative to a Processing Carrier", naming Rickie C. Lake et al. as inventors, the disclosure of which is incorporated herein by reference.

TECHNICAL FIELD

The present invention relates to methods of fixturing a flexible circuit substrate and a processing carrier, methods of processing a flexible circuit, and methods of processing a flexible circuit substrate relative to a processing carrier.

BACKGROUND OF THE INVENTION

Flexible printed wiring has been utilized for many years by numerous industries. At first, flexible printed wiring was utilized in aerospace applications, and more recently, the flexible printed wiring has been implemented in many consumer products. Flexible printed wiring applications range from digital watches to commercial aircraft components, and from domestic appliances and automobiles to deep space hardware.

Flexible printed wiring provides inherent advantageous characteristics including: low weight and volume, increased reliability, flexibility and simplified assembly. Flexible printed wiring encompasses a random arrangement of printed conductors using a flexible insulating base or substrate material. A plurality of cover layers may be provided on the flexible substrate material.

The random arrangement of conductors distinguishes flexible printed wiring from collated, flat flexible cable. The capacity of flexible printed wiring circuits to bend requires that the conductors, adhesive, and cover layer materials utilized in the circuit be flexible similar to the base material.

Flexible printed wiring may comprise various combinations of base, conductor, and cover layers. For example, single-sided flexible printed wiring has conductors on one side of a base layer. Double-sided flexible printed wiring includes conductors on both sides of the base layer. Single access flexible printed wiring includes a given conductor layer accessible from an external connection on one side. Double access flexible printed wiring includes a conductor layer accessible via an external connection from either the conductor side or the base side thereof.

Multi-layer flexible printed wiring includes more than two conductor layers laminated together with insulating base layers between the conductive layers. Rigid-flex flexible printed wiring includes two or more rigid sections having one or more flexible sections provided therebetween. Rigidized flexible printed wiring includes a plurality of rigid sheet material pieces selectively bonded to the flexible printed wiring.

The utilization of a single flexible printed wiring array reduces the number of terminals and soldered joints required for combining component mounting areas with conventional interconnecting cables. Further, plated-through holes between conductored layers in flexible printed wiring are more reliable than the soldered joints and edge connectors which they can replace in conventional connection devices.

Beneficial characteristics of flexible printed wiring include inherent improved flexibility and lower mass per length which reduce strain on soldered joints. These characteristics of flexible printed wiring provide circuits of enhanced reliability compared to round wire when subjected to shocks and vibrations. Flexible printed wiring has increased resistance to damage and flexure when compared with conventional round wire because the conductor material can be positioned closer to the neutral surface and because the bond between the conductors and insulation is uniformly distributed over a larger area.

Flexible printed wiring typically requires special pallets or fixtures, commonly referred to as processing carriers, which are utilized to position and hold the flexible printed wiring terminals during component placement, mass soldering, and testing. These processing carriers essentially support the flexible sheets of material upon which the integrated circuitry is patterned, or traces are formed. The thin flexible sheets are subjected to various processing steps including large heating steps, air drying steps, and printing steps. The thin, flexible nature of the polyester films, makes it extremely difficult, if not impossible, for the flexible sheets to be processed without being received upon a rigid temporary substrate during manufacture.

Various methods have been utilized to temporarily affix the flexible sheets to the processing carriers during the formation of the printed wiring thereon. One prior art method of attachment employs vacuum suction-like cups which are used to temporarily grasp portions of the backside of the flexible circuit substrate.

Alternately, bent pins have been utilized to hold the flexible substrate to the processing carrier. For example, upward pins may be provided at the edges of the flexible sheets. The upward pins may be bent over to grasp the outer surface of the flexible substrate to secure the flexible substrate for processing.

A plurality of holes may be provided within the flexible substrate for the sole purpose of facilitating the attachment of the flexible substrate to the processing carrier during the formation of the flexible printed wiring. Pins extend upwardly from the processing carrier through these holes. A plurality of securing devices, referred to as buttons, are positioned and pushed down upon the pins and onto the outer surface of the flexible substrate. The buttons are removed at the end of the processing of the flexible substrate.

Providing attachment through the use of such tooling pins makes certain processing steps impossible. For example, stencil printing of the flexible circuit is either difficult or impossible without damaging the stencil. Additionally, tooling is difficult to maintain when the tooling pins are utilized to secure the flexible circuit substrate.

In all of these prior art techniques, only some portion of the backside of the flexible sheet is actually retained or held fast to the processing carrier. Even where a screen is utilized as a support for a vacuum on the backside of the flexible substrate, an adhesive force is not provided at the portions where the screen physically touches the flexible substrate. In addition, the thin flexible circuits may "dimple" and stretch when vacuum is transmitted through a handling panel operating to hold the flexible circuit during processing.

Further, the utilization of a vacuum to hold the flexible circuit substrate may only be utilized at a single piece of processing equipment and may not be utilized to hold the substrate when the holding panel is transferred between various pieces of processing equipment.

One conventional technique for affixing the flexible circuit substrate to the processing carrier includes the external taping of corners of the upper surface of the substrate to the holding panel. However, such a method prevents processing of the portions of the substrate which are beneath the external tape. Further, such a method fails to prevent airflows created by the processing equipment (e.g., curing oven) from lifting an unrestrained area of the flexible circuit. Still further, taping of the corners of the substrate during certain processing steps, such as screen printing, is undesirable inasmuch as the film has a tendency to stick to the screen or stencil and lift upwards away from the rigid processing carrier.

In addition, further processing steps may not be immediately performed when the prior art methods of attachment are utilized. In particular, the outer surface of the flexible substrate sheets cannot be encapsulated on the processing carrier if prior art pins and/or external taping are utilized for affixing the flexible sheets. Specifically, the external tape attached to the top of the flexible substrate, or the pins protruding through the upper surface, or the buttons coupled with the pins, would be completely encapsulated precluding practical removal from the processing carriers.

Therefore, there exists a need for providing improved methods for securing flexible circuit substrates against the processing carrier during the formation of flexible printed wiring circuits.

SUMMARY OF THE INVENTION

Methods of fixturing a flexible circuit substrate to a processing carrier are disclosed. In one implementation, the flexible circuit substrate and processing carrier are attached with an adhesive film provided therebetween. The adhesive film comprises acrylic, silicone or a silicone acrylic blend in preferred embodiments of the present invention. Ideally, substantially the total surface area of a first surface of the flexible circuit substrate is attached to the processing carrier. The flexible circuit substrate is removed from the adhesive film and processing carrier following processing thereof. In a preferred embodiment of the present invention, the adhesive film is monolithic. An electrical component is attached to the flexible circuit substrate and the flexible circuit substrate is subsequently encapsulated in accordance with one implementation of the present invention.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
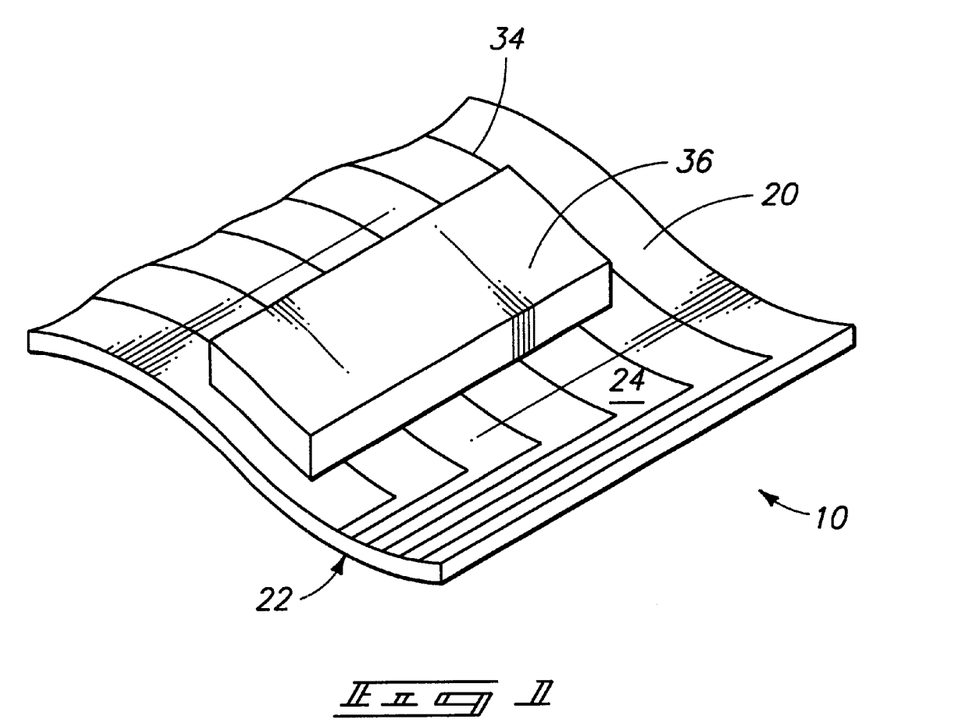
FIG. 1 is an isometric view of a flexible circuit having an integrated circuit chip mounted thereon.

Referring to FIG. 1, a processed flexible circuit 10 is shown. The flexible circuit 10 is a flexible printed wiring circuit. Although a preferred method is described herein with reference to a single-sided flexible circuit 10, the present invention is not limited to such circuits. The methods of the present invention may be utilized in the fabrication of any flexible circuit where fixturing of a flexible circuit substrate to a processing carrier is desired.

The flexible circuit 10 comprises a flexible circuit substrate 20 and a plurality of printed conductors 34 formed thereon for electrically coupling electrical components mounted thereto. The flexible circuit substrate 20 includes a first surface 22 (not specifically visible in FIG. 1) and a second surface 24 opposite thereto. The printed conductors 34 are formed on second surface 24. An exemplary integrated circuit chip 36 is mounted to the substrate 20 and operably connected with some of the conductors 34.

The flexible circuit substrate 20 preferably comprises a dielectric substrate which is the base film upon which the printed conductors 34 are formed providing electrical connections within the flexible circuit 10. The flexible circuit substrate 20 is operable to insulate printed conductors from one another, provide mechanical strength and permit flexing. The "flexible circuit substrate" as used herein refers to any is flexible supporting or supportive structure, including, but not limited to, a supportive single layer of material or multiple layer constructions. For example, the flexible circuit substrate 20 may comprise polyester, polyimide, fluorocarbon, aramid paper, or a composite thereof. The flexible circuit substrate 20 preferably comprises a polyester film having a thickness of around 5 mils.

Figure 2:
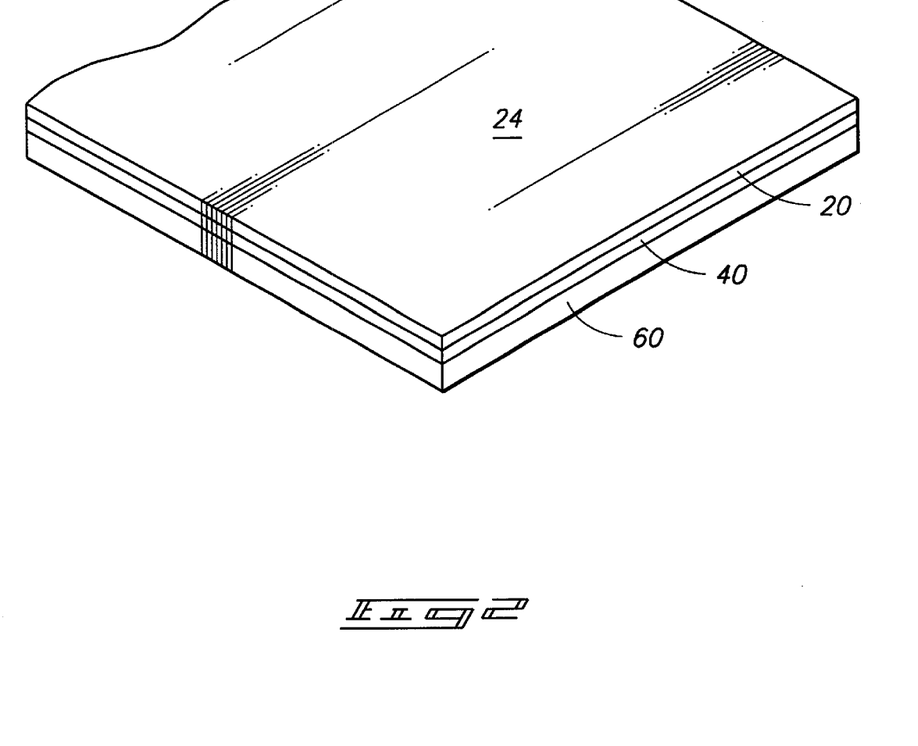
FIG. 2 is an isometric view of a flexible circuit substrate fixtured to a processing carrier with an adhesive film therebetween.
Figure 3:
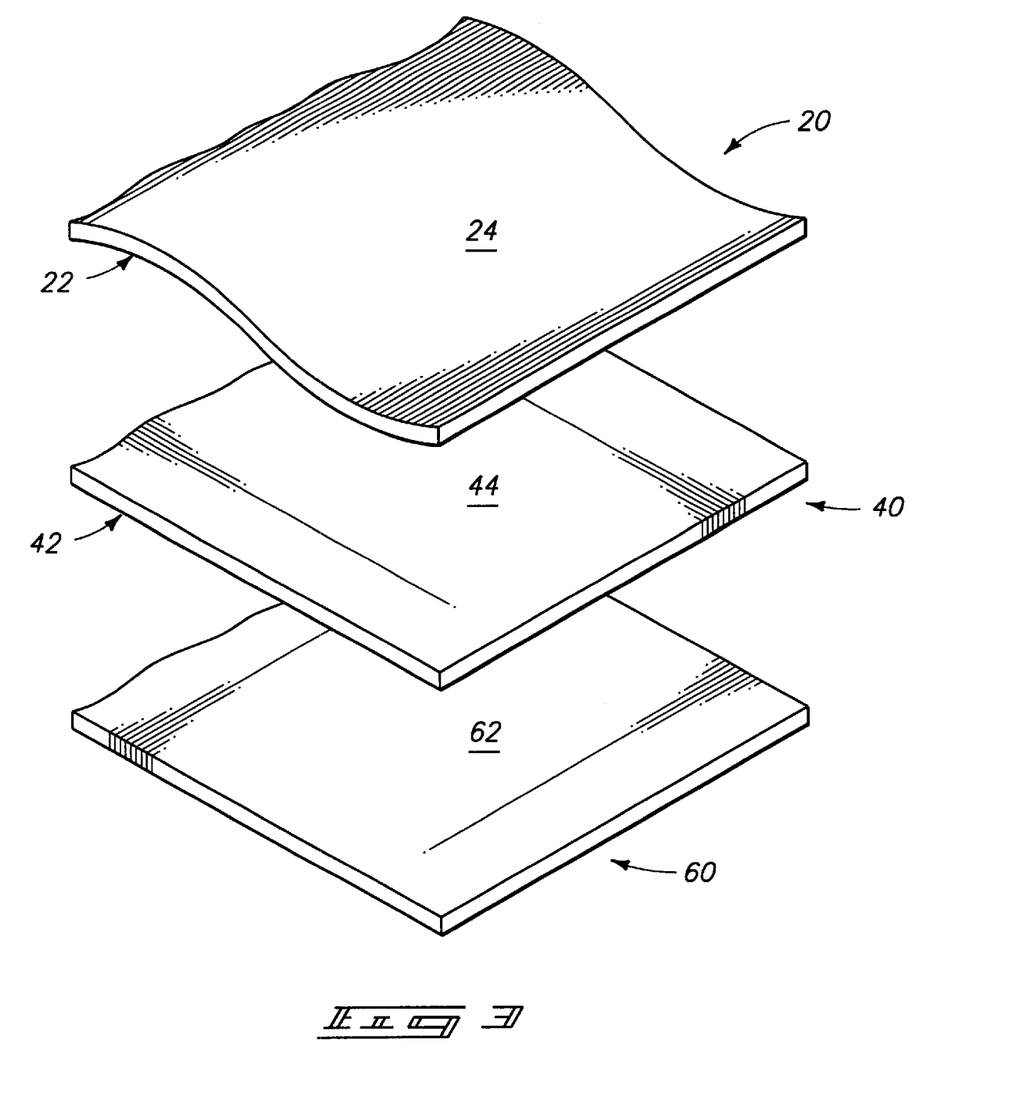
FIG. 3 is an exploded isometric view of FIG. 2.

Referring to FIGS. 2 and 3, the flexible circuit substrate 20 is shown at a processing step prior to that depicted by FIG. 1. Specifically, the flexible circuit substrate 20 is adhered to a processing carrier 60, in the form of a rigid plate, with an intervening adhesive film 40. Processing carrier 60 preferably comprises a flat, rigid material such as glass, metal plate, or a composite material panel. Processing carrier 60 includes an outer support surface 62.

The adhesive film 40 is preferably monolithic including a first adherent surface 42 and a second adherent surface 44.

The first adherent surface 42 adheres to processing carrier support surface 62. The second adherent surface 44 adheres to the flexible substrate first surface 22. The first adherent surface 42 and second adherent surface 44 of the adhesive film 40 can be configured to provide equal degrees of adhesion force relative to the processing carrier 60 and relative to the flexible substrate 20. Alternately, the adhesive film 40 can be configured to provide different degrees of adhesion force relative to the processing carrier 60 and relative to the flexible substrate 20.

For example, the first adherent surface 42 may be a high tack surface which provides a first adhesion force which is greater than a second adhesion force provided by the second adherent surface 44 (i.e., low tack surface). Alternatively, the second adherent surface 44 may be a high tack surface which provides a first adhesion force which is greater than a second adhesion force provided by a low tack first adherent surface 42. The materials of the surfaces 22 and 62 also play a role in the ultimate adhesive force between the flexible substrate 20 and the adhesive film 40, and between the processing carrier 60 and the adhesive film 40, respectively.

An exemplary method of forming an adhesive film 40 having a high tack surface and low tack surface is described with reference to FIG. 4. A first film 31 is provided in the form of a first roll 50a. A second film 32 is provided in the form of a second roll 50b. The first film 31 includes first adherent surface 42 and a medial adherent surface 37 opposite thereto. The second film 32 includes second adherent surface 44 and a medial adherent surface 38. A protective release liner 46 covers the first adherent surface 42 and a second protective release liner 48 covers the second adherent surface 44.

Figure 4:
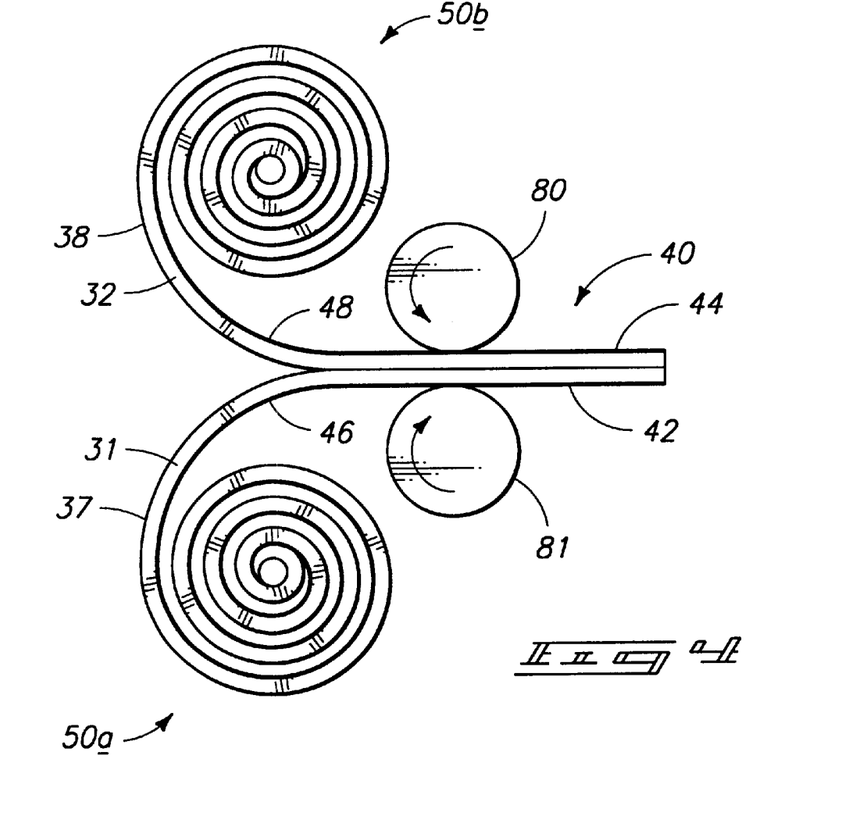
FIG. 4 shows a processing step of forming a unitary adhesive film from a first film and second film.

First film 31 and second film 32 are unwound from respective rolls 50a, 50b and aligned such that the medial adherent surfaces 37, 38 are opposite one another as shown in FIG. 4. First film 31 and 13 second film 32 are inserted intermediate a pair of mating rollers which includes an upper roller 80 and lower roller 81. The films 31, 32 are drawn therebetween to join and form a unitary adhesive film 40. Drawing first film 31 and second film 32 through rollers 80, 81 bonds the medial adherent surfaces 37, 38 and forms adhesive film 40.

Figure 5:
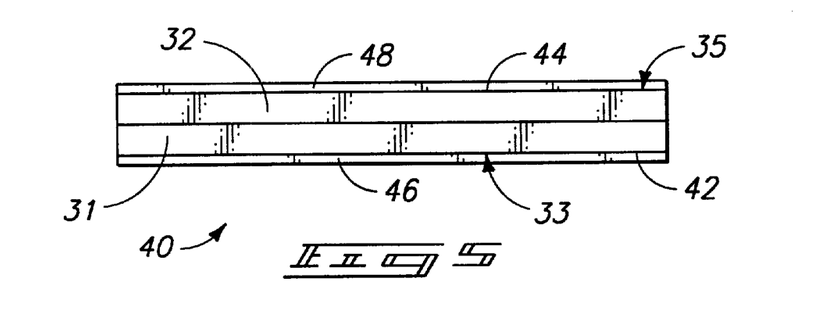
FIG. 5 shows the unitary adhesive film formed by the processing step of FIG. 4.

Referring to FIG. 5, the unitary adhesive film 40 includes opposing outer sides 33, 35. The unitary adhesive film 40 has the first adherent surface 42 and second adherent surface 44 on respective outer sides 33, 35. The first adherent surface 42 is covered by protective release liner 46, and the second adherent surface 44 is covered by protective release liner 48. First film 31 and second film 32 may be high tack and low tack adhesives, respectively. In such a configuration, the first adhesion force of first adherent surface 42 is greater than the second adhesion force of second adherent surface 44. Alternately, first film 31 and second film 32 may be low tack and high tack adhesives, respectively. In this configuration, the first adhesion force of first adherent surface 42 is less than the second adhesion force of second adherent surface 44.

Adhesive film 40 preferably comprises a monolithic pressure sensitive silicone, acrylic or silicone acrylic blend adhesive tape. Adhesive film 40 is preferably 1–4 mils thick and is available under the designation SIL-XX from Systems Division Incorporated of Tustin, Calif.

Figure 6:
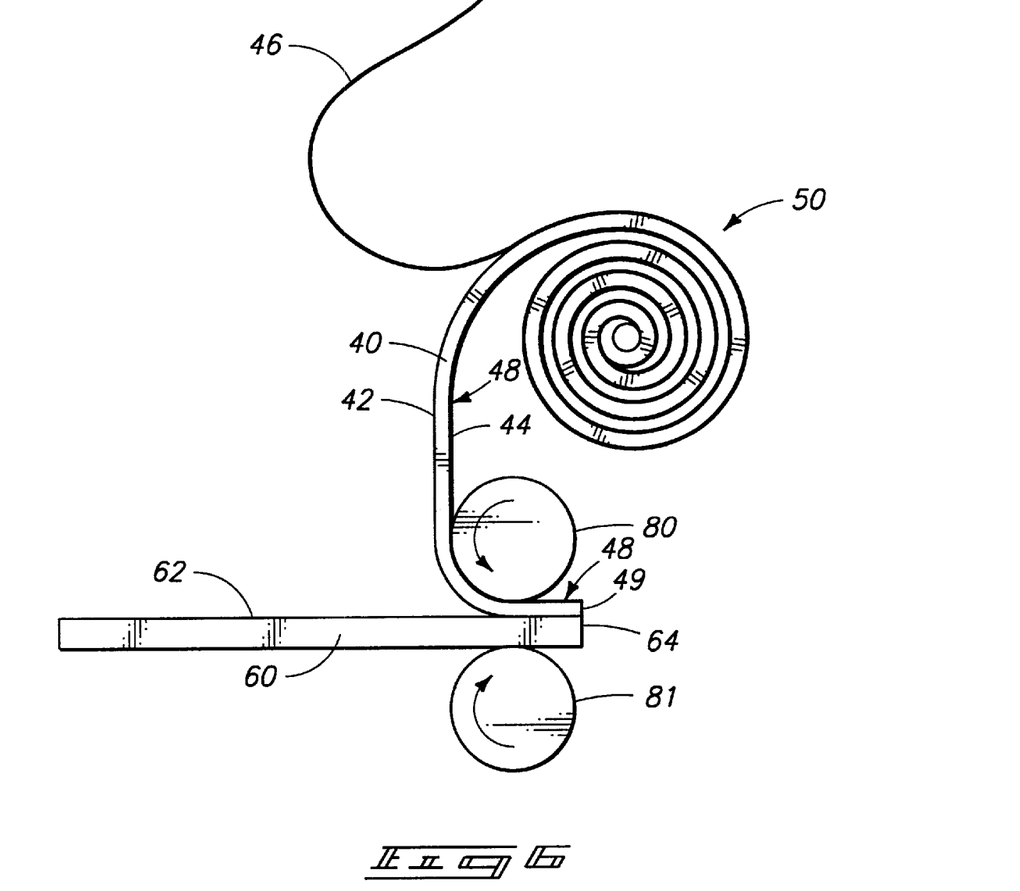
FIG. 6 shows a processing step in accordance with the present invention of removing a release liner from a first adherent surface of the adhesive film and applying the adhesive film to the processing carrier.

An exemplary preferred method of adhering the processing carrier 60, adhesive film 40 and flexible substrate 20 together is described with reference to FIGS. 6–8. Adhesive film 40 is provided in the form of a roll 50 having a protective release liner 46 provided over first adherent surface 42 and a protective release liner 48 provided over second adherent surface 44. Providing an adhesive film 40 having two liners 46, 48 is preferred but not necessary.

The adhesive film roll 50 is provided adjacent first upper roller 80 and first lower roller 81. Adhesive film 42 includes a leading end 49 and processing carrier 60 a leading end 64. Release liner 46 is peeled away from adherent surface 42 at leading end 49, with leading end 49 then being aligned with processing carrier leading end 64. The processing carrier 60 and the adhesive film 40 are then driven between rolls 80 and 81, while peeling away release liner 46, to uniformly adhere adherent surface 42 to all of processing carrier support surface 62.

Figure 7:
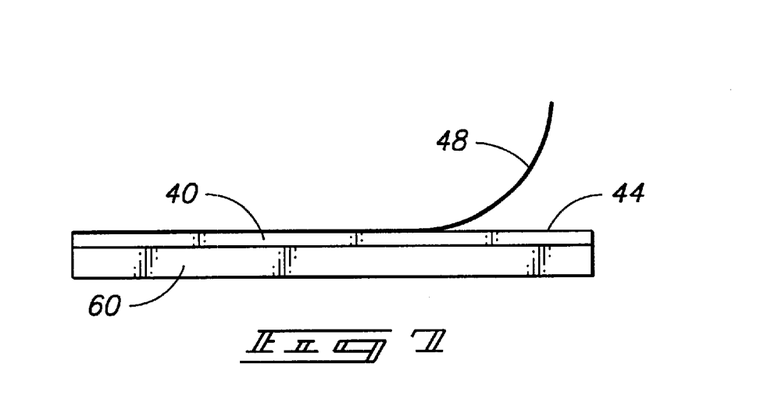
FIG. 7 shows a processing step in accordance with the present invention of removing a second release liner from a second adherent surface of the adhesive film.

Referring to FIG. 7, the adhesive film 40 is shown laminated to the processing carrier 60 following passage thereof through the pair of first rollers 80, 81. The second release liner 48 is now removed from the adhesive film 40. The removal of the second release liner 48 exposes the second adherent surface 44 of the adhesive film 40.

Figure 8:
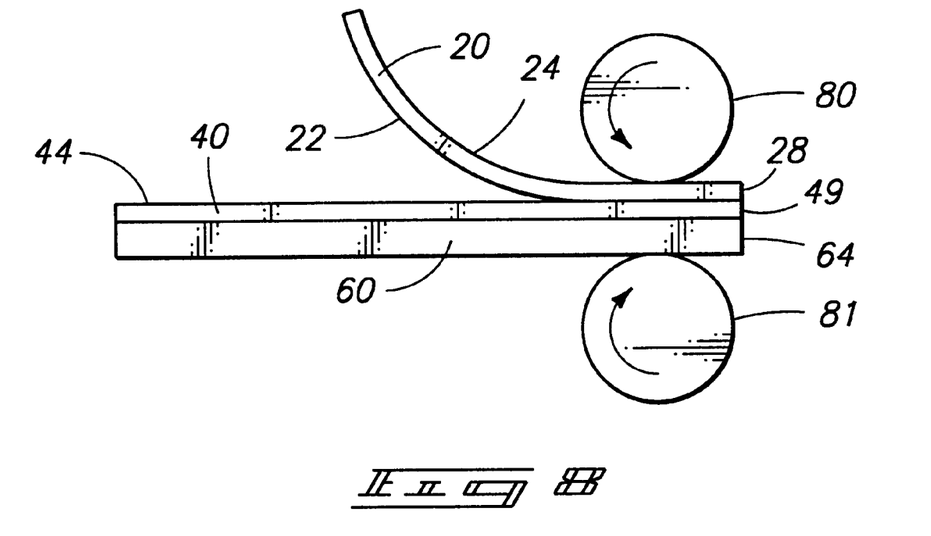
FIG. 8 shows a processing step in accordance with the present invention of adhering the flexible circuit substrate to the second adherent surface of the adhesive film.

Referring to FIG. 8, the flexible circuit substrate 20 is then applied to the processing carrier 60. Specifically, the flexible circuit substrate 20 is provided in an orientation such that the first surface 22 is opposite to the second adherent surface 44 of the adhesive film 40. Flexible circuit substrate 20 includes a leading end 28 which is aligned 14 with the leading end 64 of the processing carrier 60 and the leading end 49 of the adhesive film 40, and is then inserted intermediate the rollers 80, 81, with the spacing therebetween being adjusted if necessary.

The flexible circuit substrate surface 22 is then pressed onto the second adherent surface 44 of the adhesive film 40 as the processing carrier 60 and flexible circuit substrate 20 are drawn between the pair of rollers 80, 81. Such provides one implementation whereby the total substantial surface area of the first surface 22 of the flexible circuit substrate 20 is attached to the support surface 62 of the processing carrier 60. Such a complete attachment facilitates processing of the flexible circuit substrate 20. Alternately, but less preferred, strips of adhesive film could be provided intermediate the processing carrier 60 and flexible circuit substrate 20. In addition, by way of example only, adhesive film 40 can be provided in the form of cut sheets corresponding in size to that of the processing carrier 60.

Alternately, by way of example only, the adhesive film 40 could be provided pre-applied to the flexible substrate 20 prior to joining with processing carrier 60, or pre-applied to processing carrier 60 prior to joining with the flexible substrate 20. Regardless, the fixtured flexible substrate is then subjected to various processing, such as the printing of circuit wiring 34 thereon and adhering electronic devices thereto. Such can ultimately include application of encapsulating material (described below) outwardly of flexible substrate surface 24 while fixtured to processing carrier 60 in the preferred embodiment, something heretofore not practically achievable. In the exemplary embodiment, no temporary fixturing materials or components are received over or project outwardly of substrate surface 24, enabling such encapsulation.

Figure 9:
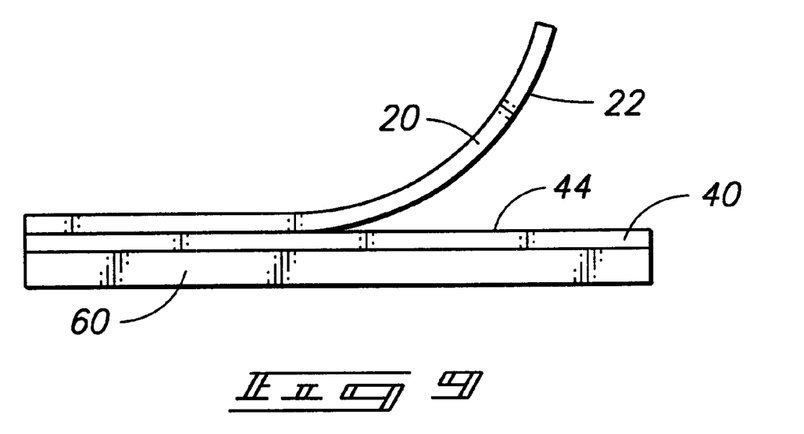
FIG. 9 shows a processing step in accordance with the present invention of removing the flexible circuit substrate from the adhesive film.

Referring to FIG. 9, the flexible circuit substrate 20 is subsequently removed from the processing carrier 60 following the processing of the flexible circuit 10. Depending upon the degrees of adhesion, the adhesive film 40 will either stay with processing carrier 60 or be removed with flexible substrate 20. Preferably, the adhesive film 40 remains attached to the processing carrier 60 (as shown in FIG. 9), enabling possible reuse of the adhesive film 40 with another flexible circuit substrate 20.

The methods of fixturing the flexible circuit substrate 20 to the processing carrier 60 in accordance with the preferred embodiment provide numerous benefits. First, the processing carrier 60 may be transferred from one piece of process equipment to another without having to remove the flexible circuit substrate 20 attached thereto. Fixturing of the flexible circuit substrate 20 to the processing carrier 60 with the adhesive film 40 prevents dimple or stretch of the flexible circuit substrate 20. Further, the adhesive film 40 affixes substantially the total surface area of the first surface 22 of the flexible circuit substrate 20 to the processing carrier 60. The adhesive film 40 ideally holds the flexible circuit substrate 20 uniformly across substantially the entire first surface 22 thereof.

Attachment of the total surface of the flexible circuit substrate 20 to the processing carrier 60 during processing prevents the flexible circuit substrate 20 from being raised during certain processing steps, including blowing of air against the flexible circuit substrate 20. Additionally, attaching substantially the total surface area of the flexible circuit substrate 20 to the processing carrier 60 eliminates the tendency of the flexible circuit 10 to attach to the stencil or screen and lift apart from the processing carrier 60 during stencil or screen printing.

Fixturing of the flexible circuit substrate 20 to the processing carrier 60 by the disclosed methods permits unobstructed processing of the unattached surface (i.e., the second surface 24) of the flexible circuit substrate 20. Such methods may be tailored for compatibility with the specific processing carrier 60 being utilized, the flexible circuit 10 materials, and the processing environment.

Further exemplary utilization of the above technology is described with reference to FIGS. 10–12. The flexible circuit substrate 20 is processed to define a plurality of individual devices 21, which will ultimately be singulated from substrate 20. Example devices include RFID cards. The flexible circuit substrate 20 is placed in a stencil or other printer in which conductive epoxy is applied thereover following the fixturing of the flexible circuit substrate 20 to the processing carrier 60.

Figure 11:
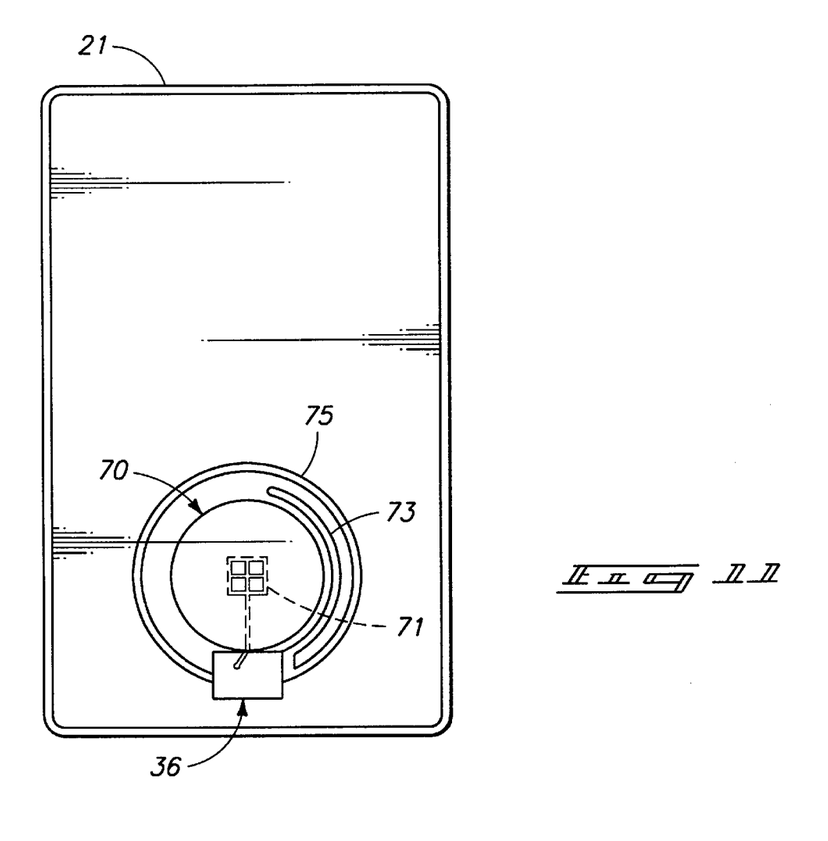
FIG. 11 is a top view of one of the individual patterns of FIG. 10.
Figure 12:
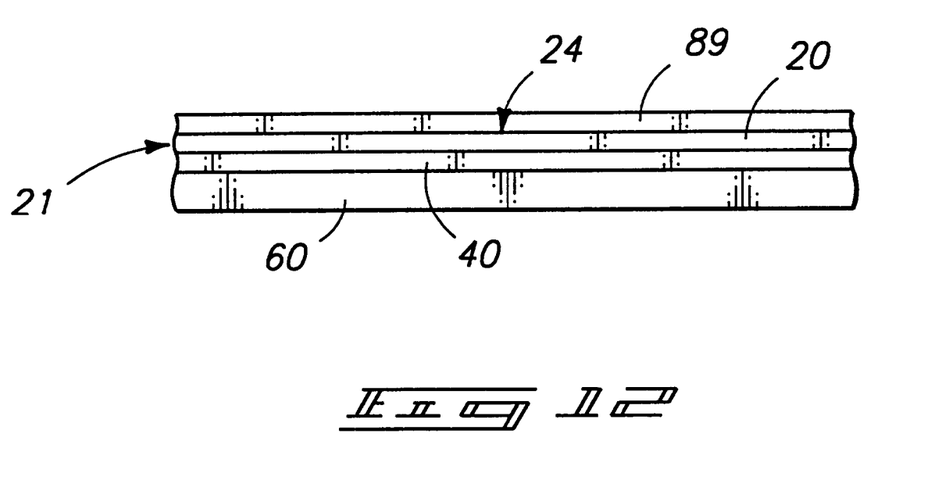
FIG. 12 is a cross-sectional view which shows various elevational layers of the device shown in FIG. 11 at an intermediate processing step.

FIG. 11 illustrates exemplary circuitry of an individual RFID device 21. Such includes circuitry in the form of a first battery connection terminal 71, a second battery connection terminal 73 and an antenna 75. A thin profile/button-type battery 70 is mounted on each of the individual substrates 21 with conductive epoxy.

An integrated circuit 36 is provided and includes suitable circuitry including transponder circuitry for receiving, processing, transmitting and/or otherwise operating upon electronic signals. Integrated circuit 36 is preferably in the form of a semiconductor chip which is operatively mounted relative to the individual substrate 21 and in electrical contact with battery 70 via a conductive ink as described in a U.S. Patent Application entitled "Methods Of Enhancing Electromagnetic Radiation Properties Of Encapsulated Circuit, And Related Device", filed the same day as the present application by Mark E. Tuttle and Rickie C. Lake as named inventors, and commonly assigned to the assignee hereof, and incorporated herein by reference. An exemplary and preferred integrated circuit 36 is described in U.S. patent application Ser. No. 08/705,043, which names James O'Toole, John R. Tuttle, Mark E. Tuttle, Tyler Lowrey, Kevin Devereaux, George Pax, Brian Higgins, Shu-Sun Yu, David Ovard and Robert Rotzoll as inventors, which was filed on Aug. 29, 1996, is assigned to the assignee of this patent application, and is incorporated herein by reference.

Figure 10:
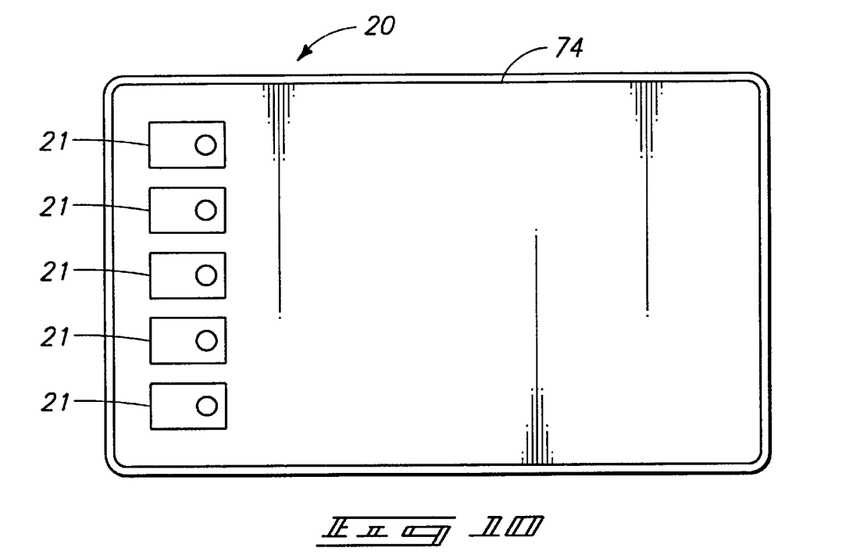
FIG. 10 is a top plan view of the flexible circuit substrate having a plurality of discrete patterns, and which is fixtured to a processing carrier.

Referring to FIG. 10, flexible circuit substrate 20 undergoes further processing in which an amount of adhesive material 74 is applied around a perimeter edge of the sheet or panel. Such applied adhesive material forms a dam relative to and inside of which encapsulating epoxy material is to be formed.

Subsequently, encapsulating epoxy material 89 (FIG. 12) is formed over flexible circuit substrate surface 24 to cover/encapsulate each of individual devices 21 while processing carrier 60 is in place. Preferably, such epoxy constitutes a two-part epoxy having a resin and a hardener which are sufficient to provide desired degrees of flex and rigidity. After application and curing of such epoxy, the processing carrier 60 and adhesive film 40 are removed and the flexible circuit substrate 20 is subjected to suitable separation or singulation processing in which individual devices 21 are cut and separated from one another.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of fixturing a flexible circuit substrate and a processing carrier, comprising:
   providing plural adhesive films individually including one of a first adherent surface and a second adherent surface providing different degrees of adhesion force;
   providing a flexible circuit substrate;
   providing a processing carrier; and
   attaching the flexible circuit substrate and the processing carrier together with one of the adhesive films coupled with the flexible circuit substrate and the other of the adhesive films coupled with the processing carrier;
   wherein the adhesive films individually comprise a blend of silicone and acrylic.

2. The method according to claim 1 wherein the plural adhesive films individually include one of a first adherent surface and a second adherent surface providing substantially equal degrees of adhesion force.

3. The method according to claim 1 wherein the adhesive films are pressure sensitive.

4. The method according to claim 1 wherein the attaching step comprises the steps of applying the adhesive films to the processing carrier and then pressing the flexible circuit substrate onto one of the adhesive films.

5. The method according to claim 1 wherein the flexible circuit substrate includes a first surface, and the attaching step comprises attaching substantially the total surface area of the first surface to one of the adhesive films.

6. The method according to claim 1 further comprising the step of separating the flexible circuit substrate and the adhesive films.

7. The method according to claim 1 wherein the processing carrier comprises a rigid plate.

8. The method according to claim 1 further comprising separating the flexible circuit substrate and the processing carrier following the attaching.

9. The method according to claim 1, wherein the first adherent surface and the second adherent surface provide different degrees of adhesion force with respect to a given material.

10. A method of fixturing a flexible circuit substrate and a processing carrier, comprising:
provibing a first film having a first adherent surface;
providing a second film having a second adherent surface;
Joining the first and second films to form a unitary adhesive film having the first adherent surface and the second adherent surface on opposing outer sides thereof prior to any coupling of either one of the first and second films with either one of a flexible circuit substrate and a processing carrier;
providing the flexible circuit substrate;
providing the processing carrier; and
attaching the flexible circuit substrate and the processing carrier together with the first film coupled with the flexible circuit substrate and the second film coupled with the processing carrier.

11. The method according to claim 10 further comprising the steps of:
adhering the first adherent surface with a first surface of the flexible circuit substrate; and
adhering the second adherent surface with a support surface of the processing carrier.

12. The method according to claim 10 wherein the first adherent surface provides a first adhesion force and the second adherent surface provides a second adhesion force; and the first adhesion force being greater than the second adhesion force.

13. The method according to claim 10 wherein the first adherent surface provides a first adhesion force and the second adherent surface provides a second adhesion force; and the first adhesion force being less than the second adhesion force.

14. The method according to claim 10 further comprising separating the flexible circuit substrate and the processing carrier following the attaching.

15. The method according to claim 10 wherein the first adherent surface provides a first adhesion force and the second adherent surface provides a second adhesion force; and the first adhesion force and second adhesion force being substantially equal.

16. A method of fixturing a flexible circuit substrate and a processing carrier, comprising:
providing plural adhesive films, wherein the adhesive films individually comprise a blend of silicone and acrylic;
providing a flexible circuit substrate;
providing a processing carrier; and
attaching the flexible circuit substrate and the processing carrier together with one of the adhesive films coupled with the flexible circuit substrate and the other of the adhesive films coupled with the processing carrier.

* * * * *

UNITED STATES PATENT AND TRADEMARK OFFICE
CERTIFICATE OF CORRECTION

PATENT NO.      : 6,458,234 B1
DATED           : October 1, 2002
INVENTOR(S)     : Rickie C. Lake et al.

It is certified that error appears in the above-identified patent and that said Letters Patent is hereby corrected as shown below:

<u>Column 5,</u>
Line 36, please delete "13" after "and".

<u>Column 6,</u>
Line 26, please delete "14" after "aligned".

Signed and Sealed this

Third Day of June, 2003

JAMES E. ROGAN
*Director of the United States Patent and Trademark Office*